United States Patent
Wu et al.

(10) Patent No.: US 6,735,485 B1
(45) Date of Patent: May 11, 2004

(54) OVERLAY REGISTRATION CORRECTION METHOD FOR MULTIPLE PRODUCT TYPE MICROELECTRONIC FABRICATION FOUNDRY FACILITY

(75) Inventors: Wen-Hung Wu, Hsinchu (TW); Kun-Pi Cheng, Tainan (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/290,925

(22) Filed: Nov. 8, 2002

(51) Int. Cl.[7] ............................................... G05B 19/00
(52) U.S. Cl. ..................... 700/57; 700/108; 700/109; 700/110; 700/121
(58) Field of Search ........................... 700/57, 108, 109, 700/110, 121

(56) References Cited

U.S. PATENT DOCUMENTS

| | | | | |
|---|---|---|---|---|
| 5,216,257 A | * | 6/1993 | Brueck et al. ............... 250/548 |
| 5,877,861 A | * | 3/1999 | Ausschnitt et al. ......... 356/401 |
| 5,923,041 A | * | 7/1999 | Cresswell et al. ........ 250/491.1 |
| 6,177,330 B1 | * | 1/2001 | Yasuda ....................... 438/401 |
| 6,309,944 B1 | * | 10/2001 | Sheng et al. ................ 438/401 |
| 6,374,396 B1 | * | 4/2002 | Baggenstoss et al. ......... 716/19 |
| 6,405,096 B1 | * | 6/2002 | Toprac et al. ............... 700/121 |
| 6,407,814 B1 | * | 6/2002 | Yasuda ....................... 356/401 |
| 6,436,595 B1 | * | 8/2002 | Credendino et al. .......... 430/22 |
| 6,531,374 B2 | * | 3/2003 | Lee et al. ................... 438/401 |
| 6,586,143 B1 | * | 7/2003 | Tan et al. ...................... 430/5 |
| 6,613,589 B2 | * | 9/2003 | Ziger .......................... 438/14 |
| 2002/0192577 A1 | * | 12/2002 | Fay et al. ..................... 430/22 |

* cited by examiner

*Primary Examiner*—Leo Picard
*Assistant Examiner*—Michael D. Masinick
(74) *Attorney, Agent, or Firm*—Tung & Associates

(57) ABSTRACT

A method for determining an overlay registration correction for a new product lot of a microelectronic product type with respect to a specific alignment tool within a foundry facility first provides for determining: (1) a first average historic overlay registration correction for historic product lots of the new product lot type with respect to the specific alignment tool; and (2) a second average historic overlay registration correction with respect to product lots of any product type with respect to the specific alignment tool. The overlay registration correction is determined as the sum of: (1) an overlay registration correction for an immediately preceding layer within the new product lot, if present; (2) a factor derived from the first average historic overlay registration correction; and (3) a factor derived from the second average historic overlay registration correction.

19 Claims, 1 Drawing Sheet

OVERLAY REGISTRATION CORRECTION METHOD FOR MULTIPLE PRODUCT TYPE MICROELECTRONIC FABRICATION FOUNDRY FACILITY

BACKGROUND OF THE INVENTION

1. Field of the Invention

The present invention relates generally to overlay registration correction methods employed for fabricating microelectronic products. More particularly, the present invention relates to efficient overlay registration correction methods employed for fabricating microelectronic products.

2. Description of the Related Art

Common in the microelectronic product fabrication art is the fabrication of multiple microelectronic product types or multiple families of microelectronic product types in a single microelectronic product fabrication facility. Such pooling of microelectronic product types for fabrication within a single microelectronic product fabrication facility is particularly common in semiconductor product fabrication. Within the context of at least semiconductor product fabrication, fabrication facilities having pooled therein multiple microelectronic product types are often referred to as "foundry" facilities.

While the use of foundry facilities provides for enhanced capacity utilization and thus enhanced manufacturing efficiency when fabricating microelectronic products, the use of foundry facilities is nonetheless not entirely without problems when fabricating microelectronic products.

In that regard, since foundry facilities are often employed for fabricating limited lot number quantities of large numbers of varied product types, it is often difficult to effectively predict and correct for tooling, process and design related variations which invariably arise incident to fabricating microelectronic products within foundry facilities. A particularly significant tooling, process and design related variation which arises incident to microelectronic product fabrication is a photomask overlay registration correction. Photomask overlay registration correction provides for proper alignment of successive layers when fabricating a microelectronic product.

It is thus desirable to provide within foundry facilities effective methods for providing proper photomask overlay registration.

It is towards the foregoing object that the present invention is directed.

Various methods for controlling and correcting overlay registration have been disclosed in the microelectronic product fabrication art.

Included but not limiting among the methods are methods disclosed within: (1) Ausschnitt et al., in U.S. Pat. No. 5,877,861 (a method for minimizing overlay registration error in cross-boundary stepping applications within which fields within successive levels within a microelectronic product straddle boundaries of fields within lower levels of the microelectronic product); (2) Cresswell et al., in U.S. Pat. No. 5,923,041 (an overlay registration measurement method which provides self correcting capabilities); and (3) Toprac et al., in U.S. Pat. No. 6,405,096 (an overlay registration method which provides enhanced microelectronic product overlay registration run-to-run control).

The teachings of each of the foregoing references are incorporated herein fully by reference.

Desirable in the microelectronic product fabrication art are additional methods for providing enhanced overlay registration control when fabricating microelectronic products, particularly within microelectronic product fabrication foundry facilities.

It is towards the foregoing object that the present invention is directed.

SUMMARY OF THE INVENTION

A first object of the invention is to provide a method for controlling overlay registration when fabricating a microelectronic product within a microelectronic product fabrication facility.

A second object of the invention is to provide a method in accord with the first object of the invention, wherein the microelectronic product fabrication facility is a foundry facility.

In accord with the objects of the invention, the invention provides a method for determining an overlay registration correction for a microelectronic product fabricated within a foundry facility.

The method first provides a foundry facility having fabricated therein a plurality of microelectronic product types. The method also provides for determining for a single microelectronic product type within the plurality of microelectronic product types, and with respect to a specific alignment tool within the foundry facility, a first average historic overlay registration correction for a first predetermined number of product lots of the single microelectronic product type previously aligned within the specific alignment tool. The method also provides for determining with respect to the specific alignment tool a second average historic overlay registration correction for a second predetermined number of product lots of any product type previously aligned within the specific alignment tool. Finally, the method provides for introducing a new product lot of the single product type into the foundry facility and aligning the new product lot within the specific alignment tool. Within the method, an overlay registration correction for the new product lot is determined as a sum of: (1) an overlay registration correction for an immediately preceding layer within the new product lot; (2) a first factor derived from the first average historic overlay registration correction; and (3) a second factor derived from the second average historic overlay registration correction.

The present invention provides a method for controlling overlay registration when fabricating a microelectronic product within a microelectronic product fabrication facility, wherein the microelectronic product fabrication facility is a foundry facility.

The present invention realizes the foregoing object within the context of a foundry facility having fabricated therein a plurality of microelectronic product types, including a single microelectronic product type within the plurality of microelectronic product types. The invention provides for: (1) determining for the single microelectronic product type within the plurality of microelectronic product types, and with respect to a specific alignment tool within the foundry facility, a first average historic overlay registration correction for a first pre-determined number of product lots of the single microelectronic product type previously aligned within the specific alignment tool; and (2) determining with respect to the specific alignment tool a second average historic overlay registration correction for a second pre-determined number of product lots of any product type previously aligned within the specific alignment tool. Thus, within the invention, upon introducing a new product lot of the single product type into the foundry facility and aligning the new product lot within the specific alignment tool, an overlay registration correction for the new product lot may be determined as a sum of: (1) an overlay registration correction for an immediately preceding layer within the new product lot; (2) a first factor derived from the first average historic overlay registration correction; and (3) a second factor derived from the second average historic overlay registration correction.

BRIEF DESCRIPTION OF THE DRAWING

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
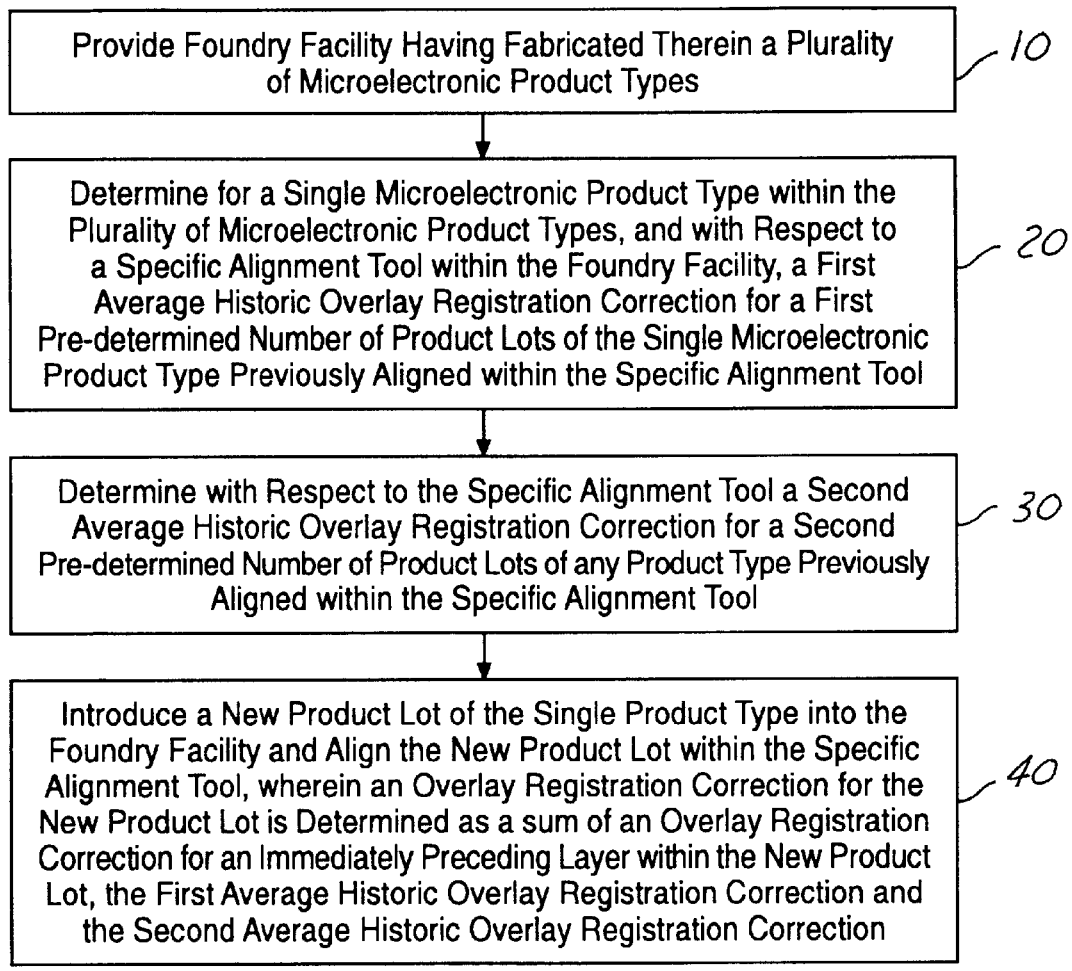
FIG. 1 shows a schematic process flow diagram illustrating a series of process steps in accord with a preferred embodiment of the invention.

The present invention provides a method for controlling overlay registration when fabricating a microelectronic product within a microelectronic product fabrication facility, wherein the microelectronic product fabrication facility is a foundry facility.

The present invention realizes the foregoing object within the context of a foundry facility having fabricated therein a plurality of microelectronic product types, including a single microelectronic product type within the plurality of microelectronic product types. The invention provides for: (1) determining for the single microelectronic product type within the plurality of microelectronic product types, and with respect to a specific alignment tool within the foundry facility, a first average historic overlay registration correction for a first pre-determined number of product lots of the single microelectronic product type previously aligned within the specific alignment tool; and (2) determining with respect to the specific alignment tool a second average historic overlay registration correction for a second pre-determined number of product lots of any product type previously aligned within the specific alignment tool. Thus, within the invention, upon introducing a new product lot of the single product type into the foundry facility and aligning the new product lot within the specific alignment tool, an overlay registration correction for the new product lot may be determined as a sum of: (1) an overlay registration correction for an immediately preceding layer within the new product lot; (2) a first factor derived from the first average historic overlay registration correction; and (3) a second factor derived from the second average historic overlay registration correction.

FIG. 1 shows a schematic process flow diagram illustrating a series of process steps in accord with a preferred embodiment of the invention.

In accord with the process step which corresponds with reference numeral 10, the invention first provides a foundry facility having fabricated therein a plurality of microelectronic product types.

The invention may be employed within the context of foundry facilities employed for fabricating microelectronic products including but not limited to integrated circuit products (including in particular semiconductor products), ceramic substrate products and optoelectronic products.

Within the invention, the plurality of microelectronic product types may be classified and distinguished within the context of any of several microelectronic product design or fabrication characteristics, including but not limited to logic product design characteristics, memory product design characteristics, embedded product design characteristics, microelectronic structure areal density characteristics and microelectronic structure linewidth characteristics. More particularly, the plurality of microelectronic product types is classified and distinguished within the invention within the context of microelectronic structure linewidth characteristics. Typical microelectronic structure linewidth characteristic distinctions may include, but are not limited to linewidths encompassing at least 0.09, 0.13 and 0.18 micron minimum linewidths.

Referring again to FIG. 1, and in accord with the block which corresponds with reference numeral 20, the invention provides for a determination for a single microelectronic product type within the plurality of microelectronic product types, and with respect to a specific alignment tool within the foundry facility, of a first average historic overlay registration correction for a first pre-determined number of product lots of the single microelectronic product type (and preferably of a single alignment level within the microelectronic product type) previously aligned within the specific alignment tool.

Within the invention, the specific alignment tool will typically be a photolithographic stepper or a photolithographic scanner, although the invention is not necessarily limited to only photolithographic alignment tools or those specific types of photolithographic alignment tools.

Within the invention, the first pre-determined number of product lots is at minimum 2, and preferably from about 3 to about 5. The first pre-determined number of product lots will typically also comprise the chronologically most recent product lots of the single microelectronic product type previously aligned within the specific alignment tool.

Within the invention and within the context of a microelectronic product having a minimum linewidth of about 0.13 microns, typical values for the first average historic overlay registration correction are generally in a range of +/−0.04 microns.

Referring again to FIG. 1 and in accord with the block which corresponds with reference numeral 30, the invention provides for determining with respect to the specific alignment tool a second average historic overlay registration correction for a second pre-determined number of product lots of any product type previously aligned within the specific alignment tool.

Within the invention, the second pre-determined number of product lots is also typically at least 2 and more preferably from about 3 to about 5. Similarly, the second pre-determined number of product lots is typically also a chronologically most recent number of product lots. Typically, the second average historic overlay registration correction will also be in a range of from about +/−0.04 microns for a microelectronic product having a minimum linewidth of about 0.13 microns.

Referring finally again to FIG. 1, and in accord with the block which corresponds with reference numeral 40, the invention provides for introducing a new product lot of the single product type into the foundry facility and aligning the new product lot (or more specifically aligning the single alignment level of the new product lot) within the specific alignment tool for which the first average historic overlay registration correction and the second average historic overlay registration correction have been determined. Within the invention, an overlay registration correction for the new product lot within the specific alignment tool is determined as a sum of: (1) an overlay registration correction for an immediately preceding layer within the new product lot (if an immediately preceding layer exists within the new product lot); (2) a first factor derived from the first average historic overlay registration correction; and (3) a second factor derived from the second average historic overlay registration correction.

Within the invention, the first factor and the second factor are typically numeric factors which are intended to allow for a comparative weighting of the first average historic overlay registration correction and the second average historic overlay registration correction when determining an overlay registration correction for the new product lot introduced into the foundry facility. Typically each of the first factor and the second factor will be in a range of from about 0 to about 1.0.

As is understood by a person skilled in the art, the method of the invention provides for optimizing an overlay registration correction for a specific layer within a new product lot introduced into a foundry facility by including within the overlay registration correction: (1) a first factor derived from a first average historic overlay registration correction component which relates to product type overlay registration correction considerations; and (2) a second factor derived from a second average historic overlay registration correction component which relates to alignment tool variability overlay registration correction considerations.

The preferred embodiment of the invention is illustrative of the invention rather than limiting of the invention. Revisions and modifications may be made to parameters and limits within the preferred embodiment of the invention while still providing a method in accord with the present invention, further in accord with the accompanying claims.

What is claimed is:

1. A method for determining an overlay registration correction for a microelectronic product fabricated within a foundry facility comprising:

provinding a foundry facility having fabricated therein a plurality of microelectronic product types;

determining for a single microelectronic product type within the plurality of microelectronic product types, and with respect to a specific alignment tool within the foundry facility, a first average historic overlay registration correction for a first pre-determined number of product lots of the single microelectronic product type previously aligned within the specific alignment tool;

determining with respect to the specific alignment tool a second average historic overlay registration correction for a second pre-determined number of product lots of any product type previously aligned within the specific alignment tool;

introducing a new product lot of the single product type into the foundry facility and aligning the new product lot within the specific alignment tool, wherein an overlay registration correction for the new product lot is determined as a sum of:

an overlay registration correction for an immediately preceding layer within the new product lot, if present;

a first factor derived from the first average historic overlay registration correction; and a second factor derived from the second average historic overlay registration correction.

2. The method of claim 1 wherein the plurality of microelectronic product types comprises integrated circuit products.

3. The method of claim 1 wherein the plurality of microelectronic product types comprises ceramic substrate products.

4. The method of claim 1 wherein the plurality of microelectronic product types comprises optoelectronic products.

5. The method of claim 1 wherein the plurality of microelectronic product types is defined with respect to differences in linewidth.

6. The method of claim 1 wherein the first pre-determined number is at least 2.

7. The method of claim 1 wherein the first pre-determined number is from 2 to 5.

8. The method of claim 1 wherein the second pre-determined number is at least 2.

9. The method of claim 1 wherein the second pre-determined number is from 2 to 5.

10. The method of claim 1 wherein the specific alignment tool is selected from the group consisting of a stepper and a scanner.

11. The method of claim 1 wherein each of the first factor and the second factor is a numeric factor in a range from 0 to 1.0.

12. A method for determining an overlay registration correction for a semiconductor product fabricated within a semiconductor foundry facility comprising:

providing a semiconductor foundry facility having fabricated therein a plurality of semiconductor product types;

determining for a single semiconductor product type within the plurality of semiconductor product types, and with respect to a specific alignment tool within the semiconductor foundry facility, a first average historic overlay registration correction for a first predetermined number of product lots of the single semiconductor product type previously aligned within the specific alignment tool;

determining with respect to the specific alignment tool a second average historic overlay registration correction for a second pre-determined number of product lots of any semiconductor product type previously aligned within the specific alignment tool;

introducing a new product lot of the single semiconductor product type into the foundry facility and aligning the new product lot within the specific alignment tool, wherein an overlay registration correction for the new product lot is determined as a sum of:

an overlay registration correction for an immediately preceding layer within the new product lot, if present;

a first factor derived from the first average historic overlay registration correction; and a second factor derived from the second average historic overlay registration correction.

13. The method of claim 12 wherein the plurality of semiconductor product types is defined with respect to differences in linewidth.

14. The method of claim 12 wherein the first pre-determined number is at least 2.

15. The method of claim 12 wherein the first pre-determined number is from 2 to 5.

16. The method of claim 12 wherein the second pre-determined number is at least 2.

17. The method of claim 12 wherein the second pre-determined number is from 2 to 5.

18. The method of claim 12 wherein the specific alignment tool is selected from the group consisting of a stepper and a scanner.

19. The method of claim 12 wherein each of the first factor and the second factor is a numeric factor in a range of from 0 to 1.0.

* * * * *